(12) United States Patent
Chen et al.

(10) Patent No.: US 10,809,757 B2
(45) Date of Patent: Oct. 20, 2020

(54) CLOCK BUFFER HAVING LOW POWER, LOW NOISE AND LOW SPUR

(71) Applicant: MEDIATEK INC., Hsin-Chu (TW)

(72) Inventors: Chien-Wei Chen, Hsin-Chu (TW); Yu-Li Hsueh, Hsin-Chu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 16/553,163

(22) Filed: Aug. 27, 2019

(65) Prior Publication Data

US 2020/0110435 A1    Apr. 9, 2020

Related U.S. Application Data (60) Provisional application No. 62/741,006, filed on Oct. 4, 2018.

(51) Int. Cl.
| | |
|---|---|
| *H03K 19/096* | (2006.01) |
| *G06F 1/06* | (2006.01) |
| *H03K 17/687* | (2006.01) |
| *H03K 19/20* | (2006.01) |

(52) U.S. Cl.
CPC .............. *G06F 1/06* (2013.01); *H03K 17/687* (2013.01); *H03K 19/20* (2013.01)

(58) Field of Classification Search
CPC ......... G06F 1/06; H03K 17/687; H03K 19/20
See application file for complete search history.

(56) References Cited

U.S. PATENT DOCUMENTS

| | | | | |
|---|---|---|---|---|
| 5,418,822 | A | * | 5/1995 | Schlachter .............. H04L 7/033 326/93 |
| 5,610,548 | A | * | 3/1997 | Masleid ........... H03K 19/01728 327/108 |
| 6,025,738 | A | * | 2/2000 | Masleid ........... H03K 19/01707 326/83 |
| 6,040,713 | A | | 3/2000 | Porter |
| 6,094,086 | A | | 7/2000 | Chow |
| 6,310,499 | B1 | * | 10/2001 | Radjassamy .............. G06F 1/06 327/175 |
| 7,068,083 | B2 | | 6/2006 | Kim |
| 8,427,209 | B2 | | 4/2013 | Gao et al. |
| 2001/0025913 | A1 | | 10/2001 | Tanimoto |
| 2010/0244907 | A1 | | 9/2010 | Gagne |

FOREIGN PATENT DOCUMENTS

| | | |
|---|---|---|
| EP | 1 271 285 A2 | 1/2003 |
| EP | 1 271 285 A3 | 1/2006 |

OTHER PUBLICATIONS

Xiang Gao, "Spur Reduction Techniques for Phase-Locked Loops Exploiting a Sub-Sampling Phase Detector", IEEE Journal of Solid-State Circuits, vol. 45, No. 9, Sep. 2010.

* cited by examiner

*Primary Examiner* — Dinh T Le
(74) *Attorney, Agent, or Firm* — Winston Hsu (57) ABSTRACT

The preset invention provides a clock buffer including a first circuit, a second circuit and an edge collector, wherein the first circuit is arranged to receive an input clock signal to generate a first clock signal, the second circuit is arranged to receive the input clock signal to generate a second clock signal, and the edge collector is arranged to generate an output clock signal by using a falling edge of the first clock signal and a rising edge of the second clock signal.

16 Claims, 9 Drawing Sheets

CLOCK BUFFER HAVING LOW POWER, LOW NOISE AND LOW SPUR

CROSS REFERENCE TO RELATED APPLICATIONS

This application claims the priority of U.S. Provisional Application No. 62/741,006, filed on Oct. 4, 2018, which is included herein by reference in its entirety.

BACKGROUND

A conventional clock buffer is generally implemented by an inverter whose N-type Metal-Oxide-Semiconductor (NMOS) and P-type MOS (PMOS) are generally designed larger for better noise performance. However, because of the rising/falling time, the NMOS and the PMOS are both turned on for a long duration, and a static current generated in this duration can dominate a power consumption of the clock signal and cause a spur to affect the other circuits, wherein the static current is greater if the NMOS and the PMOS have larger size. To solve this problem, U.S. Pat. No. 8,427,209 provides a delay circuit in front of the PMOS to control the turn-on period of the PMOS to lower the power consumption, however, this method will shorten a duty cycle of an output clock signal, and the edge of the output clock signal may be drifted to worsen the phase noise.

SUMMARY

It is therefore an objective of the present invention to provide a clock buffer which has lower power consumption, and the output clock signal generated by the clock buffer has better edges and duty cycle, to solve the above-mentioned problems.

In one embodiment of the present invention, a clock buffer comprises a first circuit, a second circuit and an edge collector, wherein the first circuit is arranged to receive an input clock signal to generate a first clock signal, the second circuit is arranged to receive the input clock signal to generate a second clock signal, and the edge collector is arranged to generate an output clock signal by using a falling edge of the first clock signal and a rising edge of the second clock signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
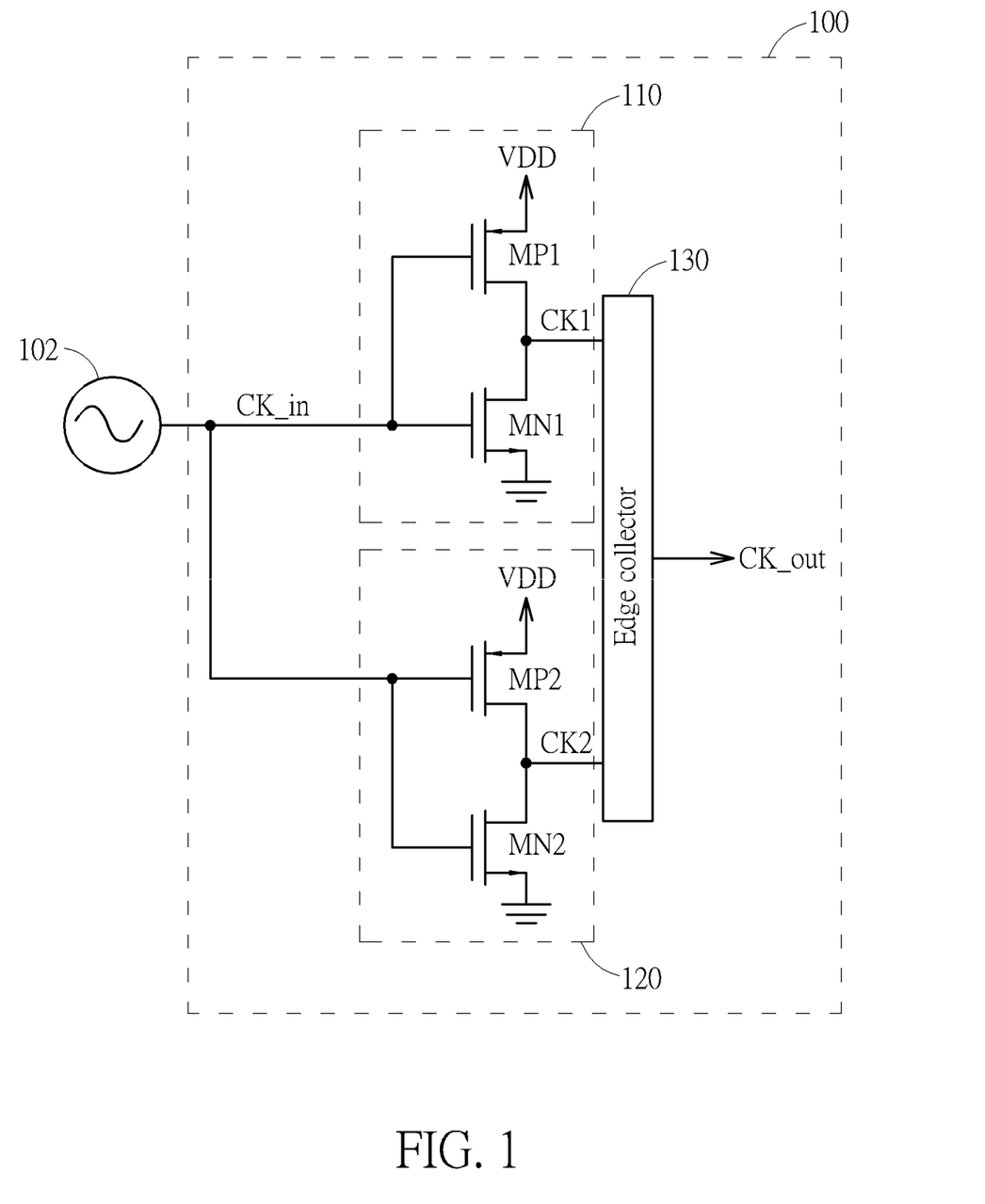
FIG. 1 is a diagram illustrating a clock buffer according to a first embodiment of the present invention.

FIG. 1 is a diagram illustrating a clock buffer 100 according to a first embodiment of the present invention. As shown in FIG. 1, the clock buffer 100 comprises a first circuit (in this embodiment, the first circuit is an inverter 110), a second circuit (in this embodiment, the second circuit is an inverter 120) and an edge collector 130. The inverter 110 comprises a PMOS MP1 and an NMOS MN1, wherein a source electrode of the PMOS MP1 is coupled to a supply voltage VDD, a drain electrode of the PMOS MP1 is coupled to a drain electrode of the NMOS MN1, a source electrode of the NMOS MN1 is coupled to a ground voltage, and a size of the NMOS MN1 is greater than a size of the PMOS MP1. The inverter 120 comprises a PMOS MP2 and an NMOS MN2, wherein a source electrode of the PMOS MP2 is coupled to the supply voltage VDD, a drain electrode of the PMOS MP2 is coupled to a drain electrode of the NMOS MN2, a source electrode of the NMOS MN2 is coupled to the ground voltage, and a size of the PMOS MP2 is greater than a size of the NMOS MN2. In this embodiment, the clock buffer 100 is configured to receive an input clock signal CK_in to generate an output clock signal CK_out, wherein the input clock signal CK_in is generated from a crystal oscillator (XO oscillator) 102.

In the operations of the clock buffer 100, the inverter 110 receives the input clock signal CK_in to generate a first clock signal CK1, the inverter 120 receives the input clock signal CK_in to generate a second clock signal CK2, and the edge collector 130 generates the output clock signal CK_out by using a falling edge of the first clock signal CK1 and a rising edge of the second clock signal CK2. In this embodiment, because the PMOS MP1 of the inverter 110 and the NMOS MN2 of the inverter 120 have small size, the static currents of the inverter 110 and the inverter 120 are much smaller than the conventional clock buffer, therefore, this skew design of the inverter 110 and the inverter 120 can significantly reduce the current consumption of the clock buffer 100 and mitigate the spur leakage. In addition, because the PMOS MP1 of the inverter 110 has smaller size, the rising edge of the first clock signal CK1 may not good enough for the high performance applications, so only the falling edge of the first clock signal CK1 is used to generate the output clock signal CK_out. Similarly, because the NMOS MN2 of the inverter 120 has smaller size, the falling edge of the second clock signal CK2 may not good enough for the high performance applications, so only the rising edge of the second clock signal CK2 is used to generate the output clock signal CK_out. In light of above, the clock buffer 100 can generate the output clock signal CK_out having better edges (i.e. less drift and phase noise) with lower power consumption.

Figure 2:
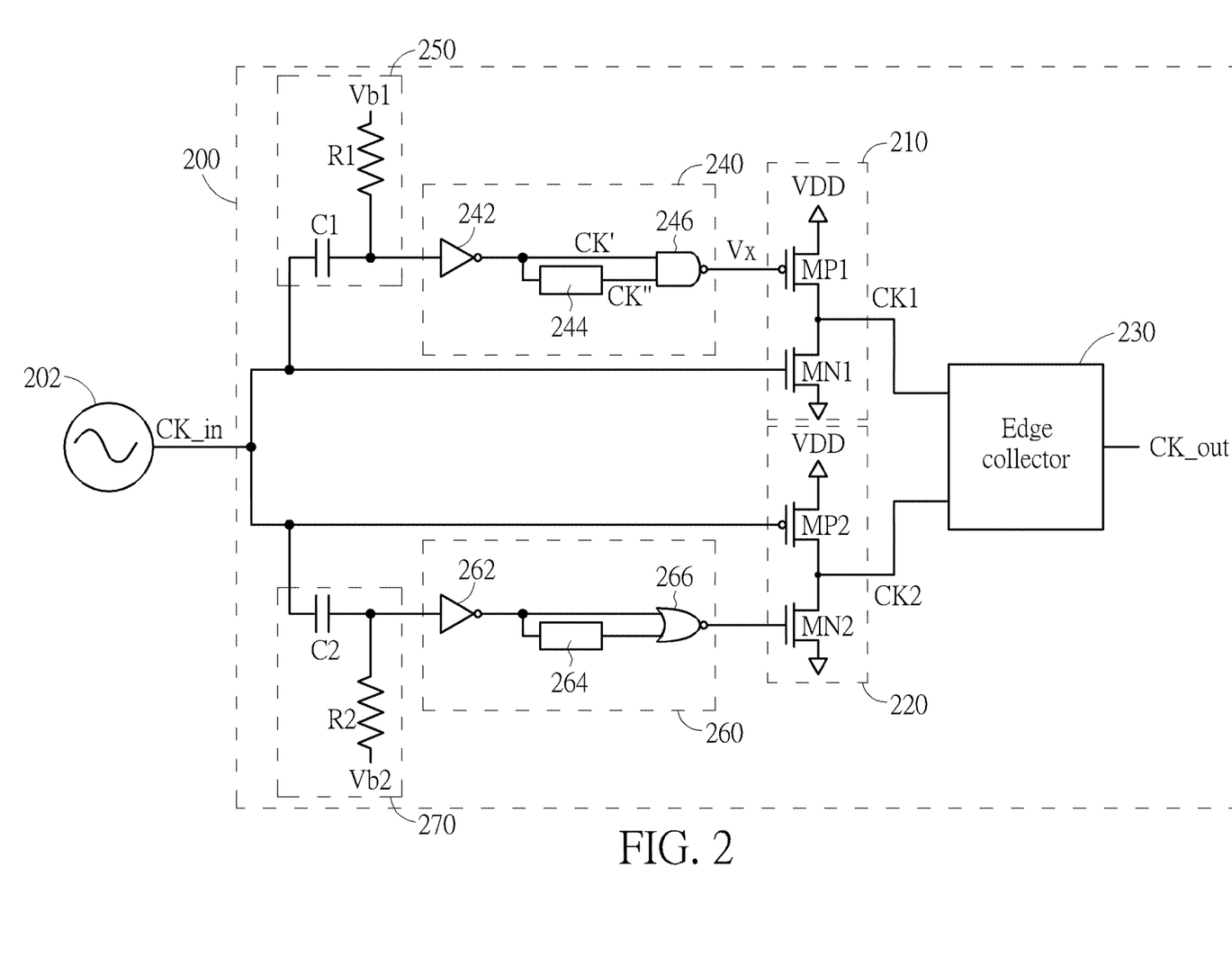
FIG. 2 is a diagram illustrating a clock buffer according to a second embodiment of the present invention.

In the embodiment shown in FIG. 1, although the power consumption of the clock buffer 100 is better than the conventional art, the PMOS MP1 and the NMOS MN1 of the inverter 110 still have time to be turned on at the same time, the PMOS MP2 and the NMOS MN2 of the inverter 120 still have time to be turned on at the same time, and the static current is generated accordingly. Therefore, in order to further reduce the power consumption, other circuits may be positioned between the input clock signal CK_in and the inverters 110/120 to avoid turning on the PMOS and NMOS at the same time. FIG. 2 shows a clock buffer 200 according to a second embodiment of the present invention. As shown in FIG. 2, the clock buffer 200 comprises a first circuit (in this embodiment, the first circuit is an inverter 210), a second circuit (in this embodiment, the second circuit is an inverter 220), an edge collector 230, a first logical circuit 240, a first high-pass filter 250, a second logical circuit 260 and a second high-pass filter 270. The inverter 210 comprises a PMOS MP1 and an NMOS MN1, wherein a source electrode of the PMOS MP1 is coupled to a supply voltage VDD, a drain electrode of the PMOS MP1 is coupled to a drain electrode of the NMOS MN1, a source electrode of the NMOS MN1 is coupled to a ground voltage. The inverter 220 comprises a PMOS MP2 and an NMOS MN2, wherein a source electrode of the PMOS MP2 is coupled to the supply voltage VDD, a drain electrode of the PMOS MP2 is coupled to a drain electrode of the NMOS MN2, a source electrode of the NMOS MN2 is coupled to the ground voltage. The first logical circuit 240 comprises an inverter 242, a delay circuit 244 and an NAND gate 246. The high pass filter 250 comprises a capacitor C1 and a resistor R1 coupled to a bias voltage Vb1. The second logical circuit 260 comprises an inverter 262, a delay circuit 264 and a NOR gate 266. The high pass filter 270 comprises a capacitor C2 and a resistor R2 coupled to a bias voltage Vb2. In this embodiment, the clock buffer 200 is configured to receive an input clock signal CK_in to generate an output clock signal CK_out, wherein the input clock signal CK_in is generated from a crystal oscillator 202.

In this embodiment, a size of the NMOS MN1 is greater than a size of the PMOS MP1, and a size of the PMOS MP2 is greater than a size of the NMOS MN2, but it's not a limitation of the present invention.

Figure 3:
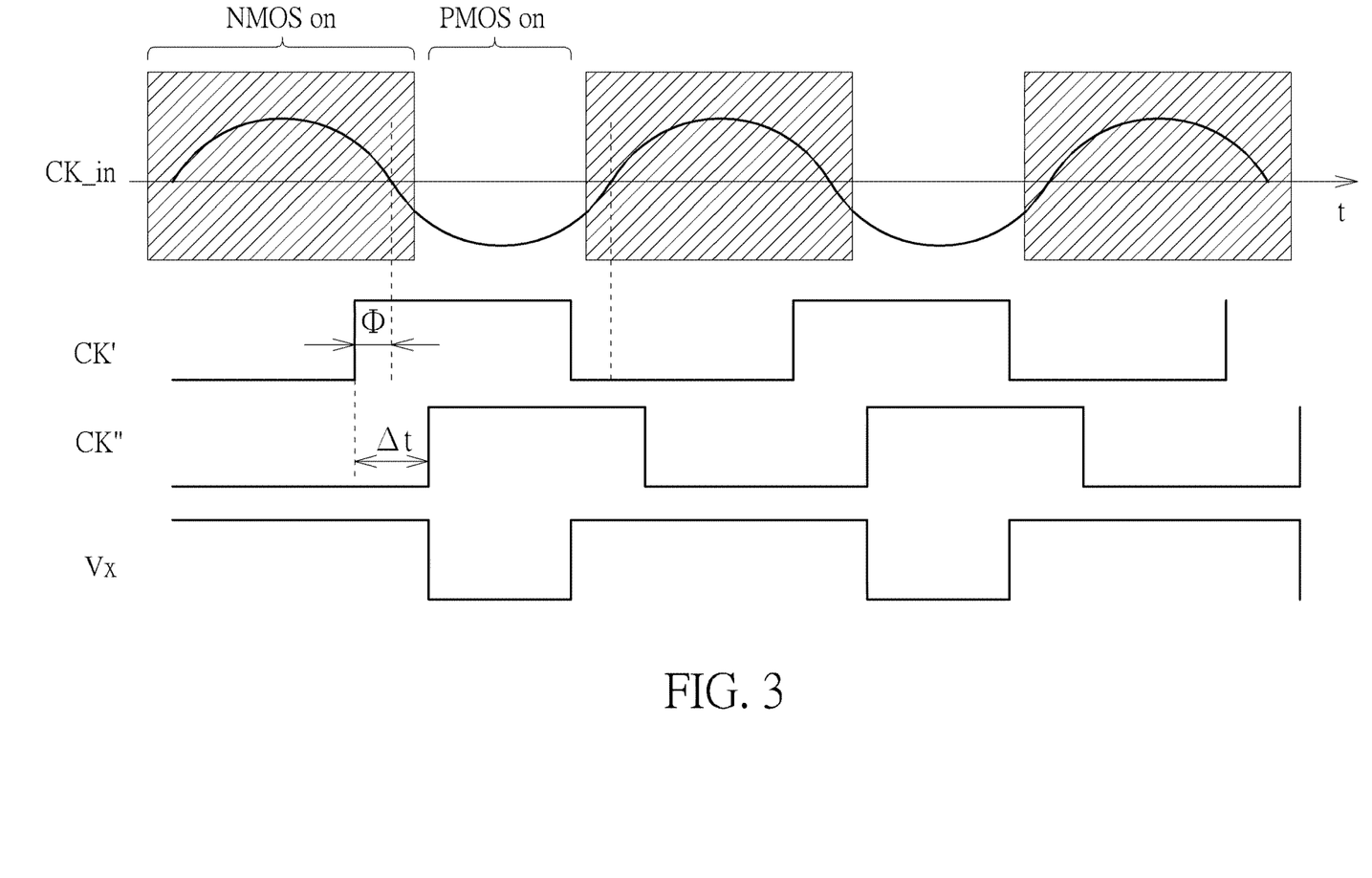
FIG. 3 shows the timing diagram of the signals related to the inverter shown in FIG. 2

In the operations of the clock buffer 200, the high pass-filter 250 filters the input clock signal CK_in to cause a negative phase shift, and the logical circuit 240 delays the input clock signal CK_in (filtered input clock signal) to generate a signal Vx to the PMOS MP1, and the PMOS MP1 and the NMOS MN1 receive the signal Vx and the input clock signal CK_in, respectively, to generate a first clock signal CK1. Similarly, the high pass-filter 270 filters the input clock signal CK_in to cause a negative phase shift, and the logical circuit 260 delays the input clock signal CK_in (filtered input clock signal) to generate a signal to the NMOS MN2, and the PMOS MP2 and the NMOS MN2 receive the input clock signal CK_in and the signal outputted by the logical circuit 260, respectively, to generate a second clock signal CK2. Then, the edge collector 230 generates the output clock signal CK_out by using a falling edge of the first clock signal CK1 and a rising edge of the second clock signal CK2. In this embodiment, because of the high-pass filter 250 and the logical circuit 240, the time when the PMOS MP1 is turned on is delayed to avoid turning on the PMOS MP1 and the NMOS MN1 of the inverter 210 at the same time. Similarly, because of the high-pass filter 270 and the logical circuit 260, the time when the NMOS MN2 is turned on is delayed to avoid turning on the PMOS MP2 and the NMOS MN2 of the inverter 220 at the same time. FIG. 3 shows the timing diagram of the signals related to the inverter 210 of the clock buffer 200, the symbol CK' is an output of the inverter 242, the symbol CK" is an output of the delay circuit 244, the symbol Φ is a phase shift provided by the high-pass filter 250, the symbol Δt is a delay amount of the delay circuit 244. As shown in FIG. 3, because the signal Vx for turning on the PMOS MP1 is not overlapped with the period that the NMOS MN1 is turned on, the static current of the inverter 210 can be greatly reduced to improve the power consumption.

In this embodiment, because the high-pass filter 250 and the logical circuit 240 is coupled between the input clock signal CK_in and the inverter 210, the rising edge of the first clock signal CK1 may not good enough for the high performance applications, so only the falling edge of the first clock signal CK1 is used to generate the output clock signal CK_out. Similarly, because the high-pass filter 270 and the logical circuit 260 is coupled between the input clock signal CK_in and the inverter 220, the falling edge of the second clock signal CK2 may not good enough for the high performance applications, so only the rising edge of the second clock signal CK2 is used to generate the output clock signal CK_out. In light of above, the clock buffer 200 can generate the output clock signal CK_out having better edges with lower power consumption.

In this embodiment, the high-pass filter 250 is used to provide the negative phase shift to control the delay amount of the signal inputted into the PMOS MP1 (the bias voltage Vb1 allows fine adjustment), and the high-pass filter 270 is used to provide the negative phase shift to control the delay amount of the signal inputted into the NMOS MN2 (the bias voltage Vb1 allows fine adjustment), and the overall delay control can be simplified by using the high-pass filters 250 and 270. In other embodiments, the high-pass filters 250 and 270 can be removed from the clock buffer 200, this alternative design shall fall within the scope of the present invention.

Figure 4:
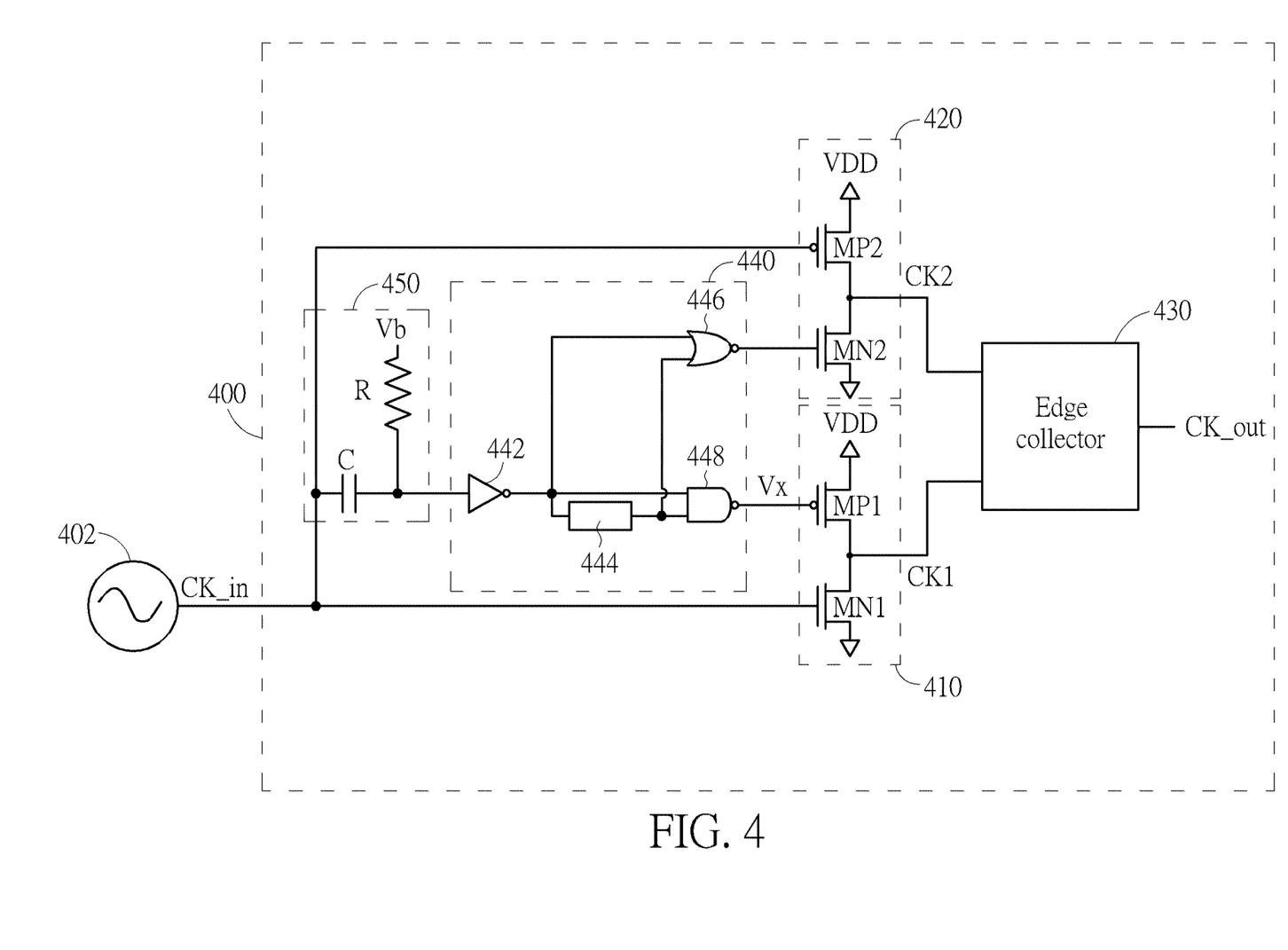
FIG. 4 is a diagram illustrating a clock buffer according to a third embodiment of the present invention.

FIG. 4 shows a clock buffer 400 according to a third embodiment of the present invention. As shown in FIG. 4, the clock buffer 400 comprises a first circuit (in this embodiment, the first circuit is an inverter 410), a second circuit (in this embodiment, the second circuit is an inverter 420), an edge collector 430, a logical circuit 440 and a high-pass filter 450. The inverter 410 comprises a PMOS MP1 and an NMOS MN1, wherein a source electrode of the PMOS MP1 is coupled to a supply voltage VDD, a drain electrode of the PMOS MP1 is coupled to a drain electrode of the NMOS MN1, a source electrode of the NMOS MN1 is coupled to a ground voltage. The inverter 420 comprises a PMOS MP2 and an NMOS MN2, wherein a source electrode of the PMOS MP2 is coupled to the supply voltage VDD, a drain electrode of the PMOS MP2 is coupled to a drain electrode of the NMOS MN2, a source electrode of the NMOS MN2 is coupled to the ground voltage. The first logical circuit 440 comprises an inverter 442, a delay circuit 444, a NOR gate 446 and an NAND gate 448. The high-pass filter 450 comprises a capacitor C and a resistor R coupled to a bias voltage Vb. In this embodiment, the clock buffer 400 is configured to receive an input clock signal CK_in to generate an output clock signal CK_out, wherein the input clock signal CK_in is generated from a crystal oscillator 402.

In this embodiment, a size of the NMOS MN1 is greater than a size of the PMOS MP1, and a size of the PMOS MP2 is greater than a size of the NMOS MN2, but it's not a limitation of the present invention.

In the operations of the clock buffer 400, the high pass-filter 450 filters the input clock signal CK_in to cause a negative phase shift, and the logical circuit 440 delays the input clock signal CK_in (filtered input clock signal) to generate signals the PMOS MP1 and the NMOS MN2, respectively. Then, the PMOS MP1 and the NMOS MN1 of the inverter 410 receive the signal from the logical circuit 440 and the input clock signal CK_in to generate a first clock signal CK1, and the PMOS MP2 and the NMOS MN2 of the inverter 420 receive the input clock signal CK_in and the signal outputted by the logical circuit 440 to generate a second clock signal CK2. Then, the edge collector 430 generates the output clock signal CK_out by using a falling edge of the first clock signal CK1 and a rising edge of the second clock signal CK2. In this embodiment, because of the high-pass filter 450 and the logical circuit 440, the time when the PMOS MP1 is turned on is delayed to avoid turning on the PMOS MP1 and the NMOS MN1 of the inverter 410 at the same time, and the time when the NMOS MN2 is turned on is delayed to avoid turning on the PMOS MP2 and the NMOS MN2 of the inverter 420 at the same time. Therefore, the static currents of the inverter 410 and 420 can be greatly reduced to improve the power consumption.

The clock buffer 400 is similar to the clock buffer 200 shown in FIG. 2, and the difference is that the logical circuits 240 and 260 and the high-pass filters 250 and 270 shown in FIG. 2 are integrated and modified to be the logical circuit 440 and the high-pass filter 450, in order to save the chip area.

Figure 5:
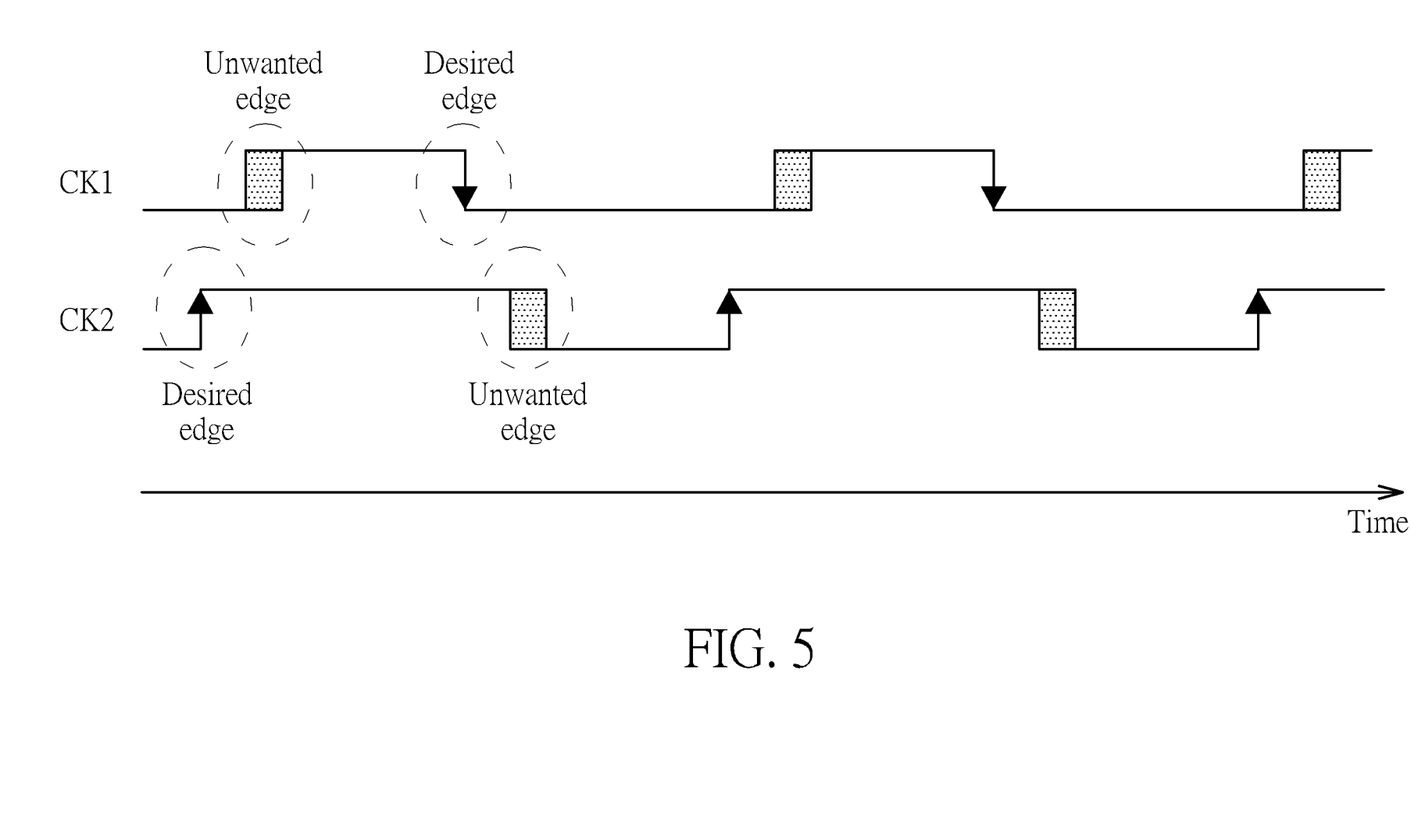
FIG. 5 shows edges of the first clock signal and the second clock signal.

In the embodiments, because of the skew design of the inverters 110 and 120 shown in FIG. 1, the logical circuits 240, 260 shown in FIG. 2 and the logical circuit 440 shown in FIG. 4, the rising edge of the first clock signal CK1 and the falling edge of the second clock signal CK2 may have phase noise and larger transition time. Therefore, the rising edge of the first clock signal CK1 and the falling edge of the second clock signal CK2 are regarded as the unwanted edge, and the falling edge of the first clock signal CK1 and the rising edge of the second clock signal CK2 are regarded as the wanted edge, as shown in FIG. 5, for the edge collector 130/230/430 to generate the output clock signal CK_out.

Figure 6:
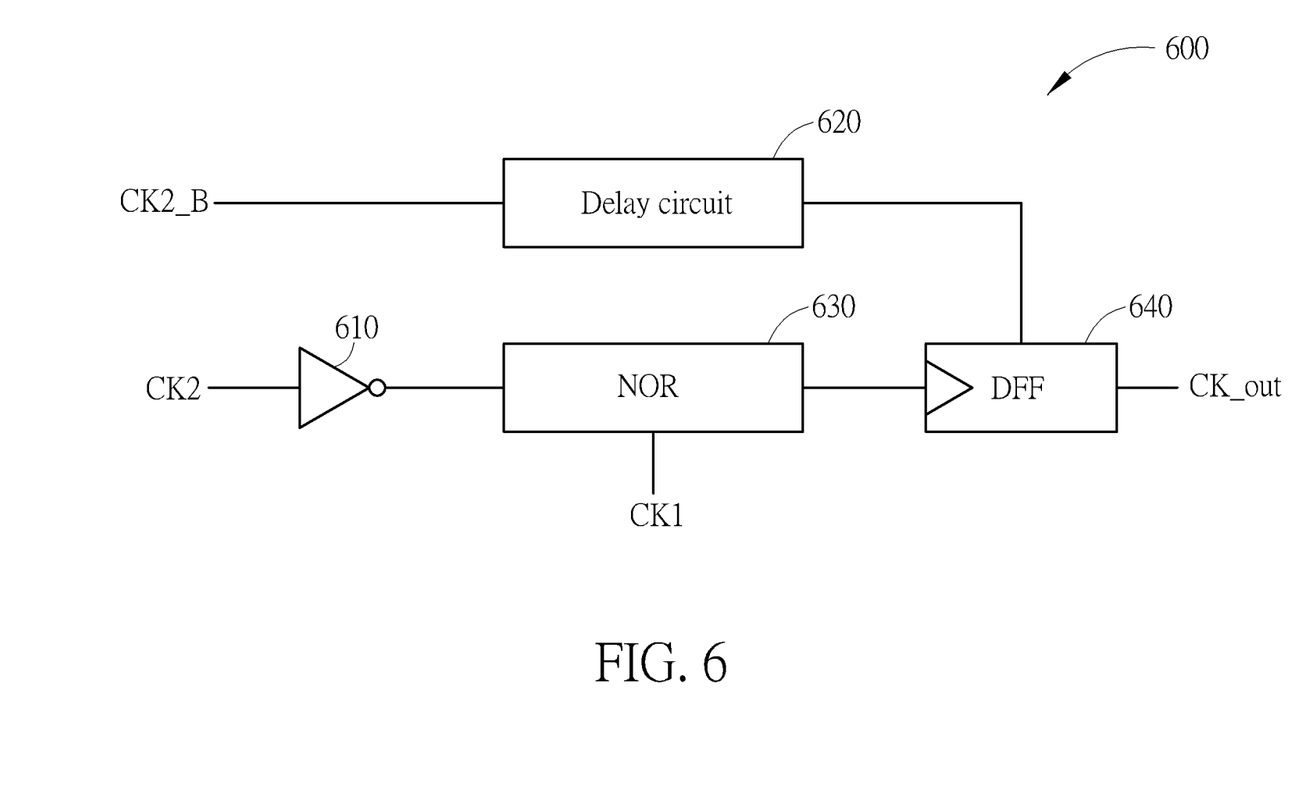
FIG. 6 is a diagram illustrating an edge collector according to one embodiment of the present invention.
Figure 7:
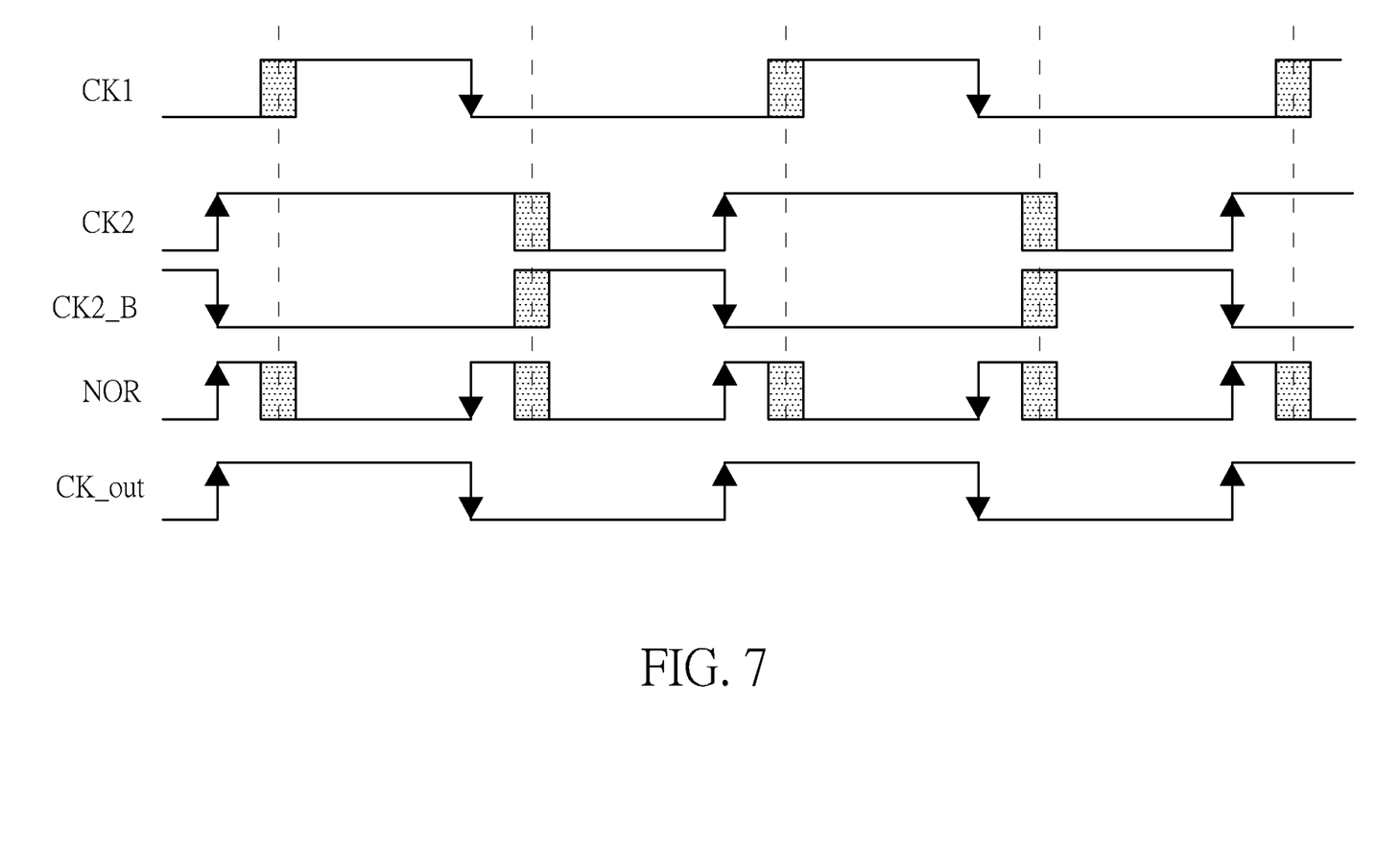
FIG. 7 shows a timing diagram of the signals shown in FIG. 6.

FIG. 6 is a diagram illustrating an edge collector 600 according to one embodiment of the present invention, wherein the edge collector 600 can be any one of the edge collector 130, 230 and 430. In FIG. 6, the edge collector 600 comprises an inverter 610, a delay circuit 620, a NOR gate 630 and a D-type flip-flop (DFF). In the operations of the edge collector 600, the inverter 610 receives the second clock signal CK2 to generate an inverted second clock signal, the NOR gate 630 receives the inverted second clock signal and the first clock signal CK1 to generate an NOR output, the delay circuit 620 delays the inverted second clock signal CK2_B, and the DFF 640 uses the NOR output to sample the output of the delay circuit 620 to generate the output clock signal CK_out. FIG. 7 shows a timing diagram of the signals shown in FIG. 6.

In addition, if the input clock signal CK_in has the duty cycle 50%, the first clock signal CK1 and the second clock signal CK2 shown in FIG. 2 and FIG. 4 may become unbalance due to the logical circuits in front of the inverters, for example, the first clock signal CK1 may have the duty cycle less than 50%, and the second clock signal may have the duty cycle greater than 50% shown in FIG. 7. By using the edge collector 600, the output clock signal CK_out has the balanced duty cycle, and is more suitable for use in the following circuits.

Figure 8:
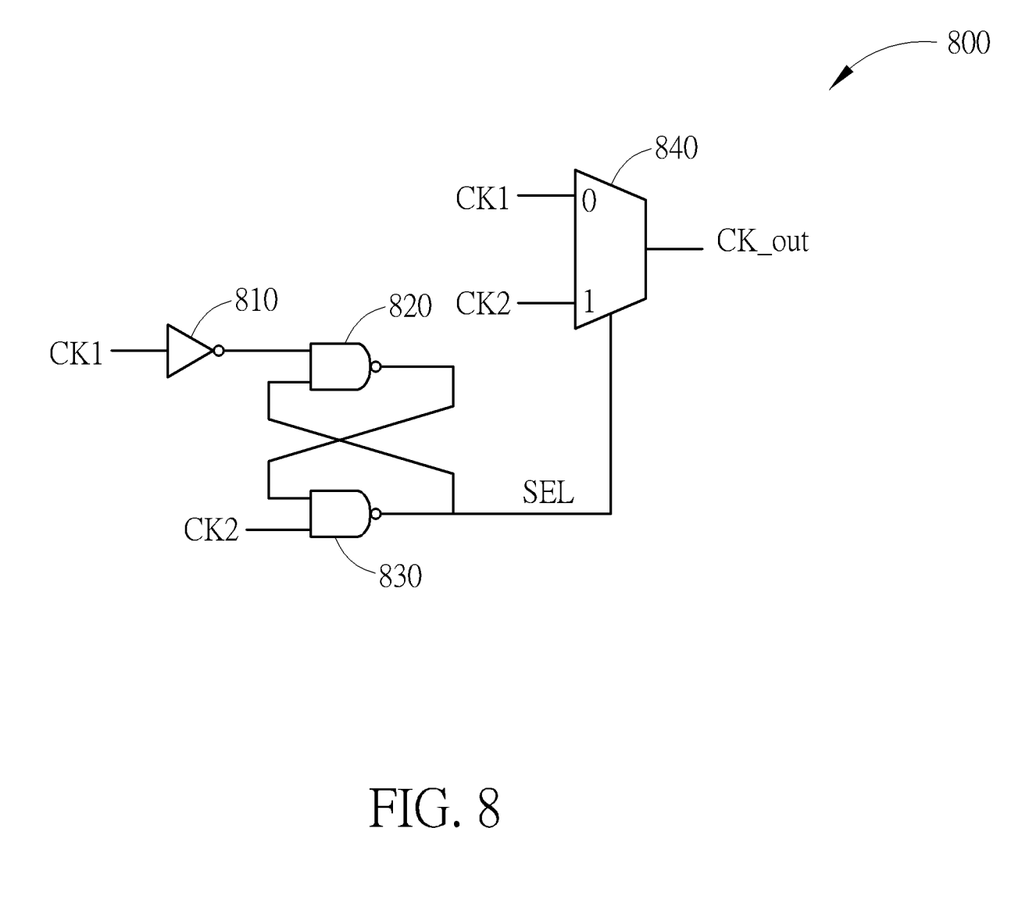
FIG. 8 is a diagram illustrating an edge collector according to another embodiment of the present invention.
Figure 9:
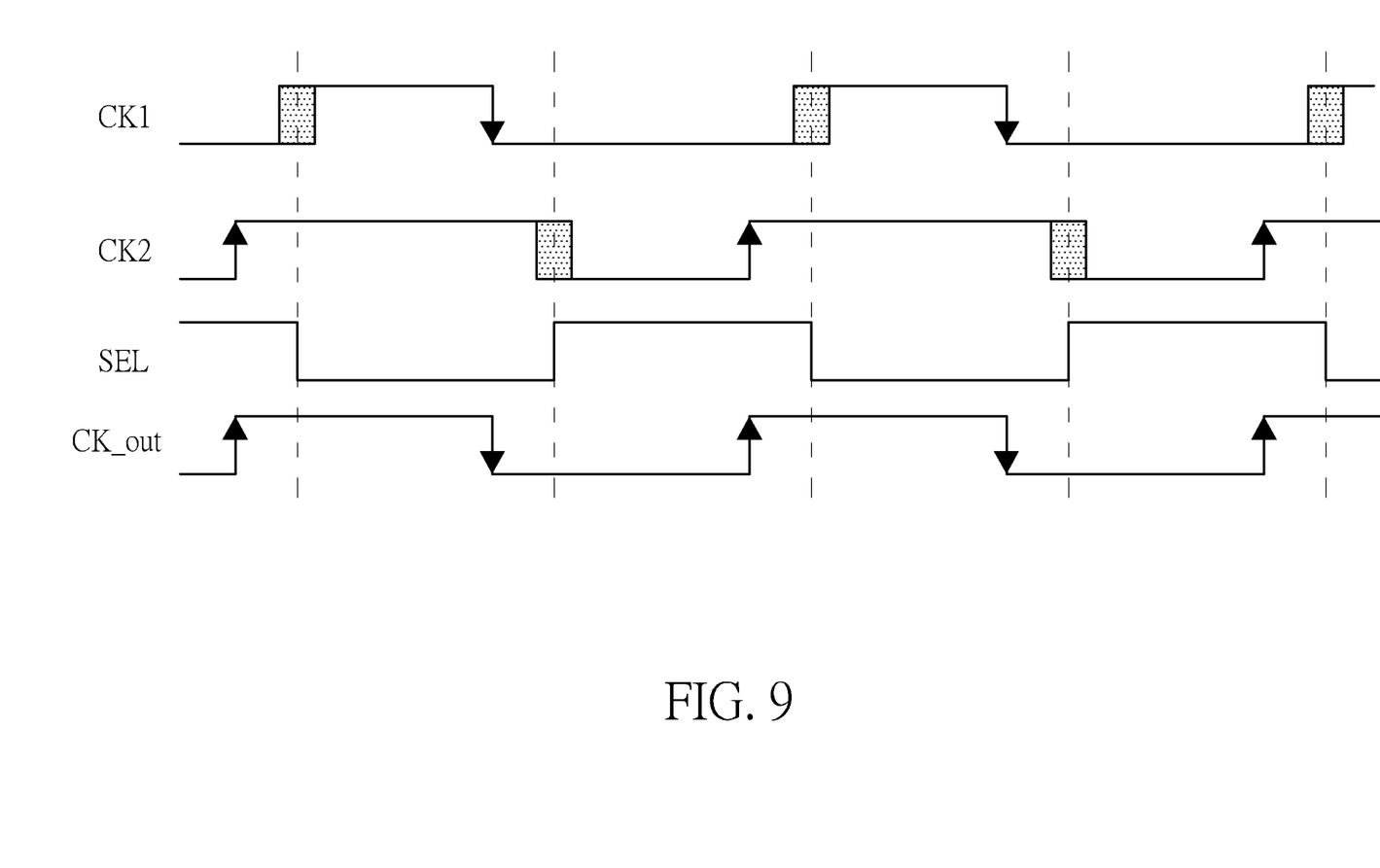
FIG. 9 shows a timing diagram of the signals shown in FIG. 8.

FIG. 8 is a diagram illustrating an edge collector 800 according to another embodiment of the preset invention. In FIG. 8, the edge collector 800 comprises an inverter 810, a latch circuit comprising two NAND gates 820 and 830, and a multiplexer 840. In the operations of the edge collector 800, the inverter 810 receives the first clock signal CK1 to generate an inverted first clock signal, and the latch circuit receives the inverted first clock signal and the second clock signal CK2 to generate a selection signal SEL to control the multiplexer 840 to output one of the first clock signal CK1 and the second clock signal CK2. FIG. 9 shows a timing diagram of the signals shown in FIG. 8.

It is noted that the edge collectors 800 and 600 are for illustrative purposes only, that is the detailed circuit structures edge collectors 800 and 600 are not limitations of the present invention.

Briefly summarized, in the clock buffer of the present invention, the clock buffer has a first circuit and a second circuit for receiving the input clock signal to generate a first clock signal and a second clock signal, respectively, wherein the first clock signal may have a better falling edge and worse rising edge, and the second clock signal may have a better rising edge and worse falling edge due to the circuit design for the power consumption. Then, the clock buffer further uses an edge collector to use the better falling edge of the first clock signal and the better rising edge of the second clock signal to generate the output clock signal. Therefore, the clock buffer has lower power consumption and is able to generate the output clock signal with higher quality, and the spur leakage is improved by removing the static current.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock buffer, comprising:
a first circuit, for receiving an input clock signal to generate a first clock signal;
a second circuit, for receiving the input clock signal to generate a second clock signal; and
an edge collector, coupled to the first circuit and the second circuit, for generating an output clock signal by using a falling edge of the first clock signal and a rising edge of the second clock signal;
wherein the first circuit comprises:
a first P-type transistor, wherein a source electrode of the first P-type transistor is coupled to a first reference voltage, and the input clock signal is inputted into a gate electrode of the first P-type transistor; and
a first N-type transistor, wherein a source electrode of the first N-type transistor is coupled to a second reference voltage, a drain electrode of the first N-type transistor is coupled to a drain electrode of the first P-type transistor for outputting the first clock signal, and the input clock signal is inputted into a gate electrode of the first N-type transistor;
wherein a size of the first N-type transistor is larger than a size of the first P-type transistor; and
the second circuit comprises:

a second P-type transistor, wherein a source electrode of the second P-type transistor is coupled to the first reference voltage, and the input clock signal is inputted into a gate electrode of the second P-type transistor; and a second N-type transistor, wherein a source electrode of the second N-type transistor is coupled to the second reference voltage, a drain electrode of the second N-type transistor is coupled to a drain electrode of the second P-type transistor for outputting the second clock signal, and the input clock signal is inputted into a gate electrode of the second N-type transistor;

wherein a size of the second P-type transistor is larger than a size of the second N-type transistor.

2. The clock buffer of claim 1, wherein the edge collector does not use a rising edge of the first clock signal and a falling edge of the second clock signal to generate the output clock signal.

3. A clock buffer, comprising:
a first circuit, for receiving an input clock signal to generate a first clock signal;
a second circuit, for receiving the input clock signal to generate a second clock signal; and
an edge collector, coupled to the first circuit and the second circuit, for generating an output clock signal by using a falling edge of the first clock signal and a rising edge of the second clock signal;
wherein the first circuit comprises:
a first P-type transistor, wherein a source electrode of the first P-type transistor is coupled to a first reference voltage;
a first logical circuit, for generating a first delayed input clock signal to a gate electrode of the first P-type transistor according to the input clock signal; and
a first N-type transistor, wherein a source electrode of the first N-type transistor is coupled to a second reference voltage, a drain electrode of the first N-type transistor is coupled to a drain electrode of the first P-type transistor for outputting the first clock signal, and the input clock signal is inputted into a gate electrode of the first N-type transistor.

4. The clock buffer of claim 3, wherein a size of the first N-type transistor is larger than a size of the first P-type transistor.

5. The clock buffer of claim 3, wherein the first circuit further comprises:
a first high-pass filter, coupled between the first logical circuit and the input clock signal.

6. The clock buffer of claim 3, wherein the second circuit comprises:
a second P-type transistor, wherein a source electrode of the second P-type transistor is coupled to the first reference voltage, and the input clock signal is inputted into a gate electrode of the second P-type transistor; and
a second N-type transistor, wherein a source electrode of the second N-type transistor is coupled to the second reference voltage, a drain electrode of the second N-type transistor is coupled to a drain electrode of the second P-type transistor for outputting the second clock signal; and
a second logical circuit, for generating a second delayed input clock signal to a gate electrode of the second N-type transistor according to the input clock signal.

7. The clock buffer of claim 6, wherein a size of the second P-type transistor is larger than a size of the second N-type transistor.

8. The clock buffer of claim 6, wherein the second circuit further comprises:
a second high-pass filter, coupled between the second logical circuit and the input clock signal.

9. A clock buffer, comprising:
a first circuit, for receiving an input clock signal to generate a first clock signal;
a second circuit, for receiving the input clock signal to generate a second clock signal; and
an edge collector, coupled to the first circuit and the second circuit, for generating an output clock signal by using a falling edge of the first clock signal and a rising edge of the second clock signal;
wherein the first circuit comprises:
a first P-type transistor, wherein a source electrode of the first P-type transistor is coupled to a first reference voltage, and the input clock signal is inputted into a gate electrode of the first P-type transistor; and
a first N-type transistor, wherein a source electrode of the first N-type transistor is coupled to a second reference voltage, a drain electrode of the first N-type transistor is coupled to a drain electrode of the first P-type transistor for outputting the first clock signal; and
the second circuit comprises:
a second P-type transistor, wherein a source electrode of the second P-type transistor is coupled to the first reference voltage; and
a second N-type transistor, wherein a source electrode of the second N-type transistor is coupled to the second reference voltage, a drain electrode of the second N-type transistor is coupled to a drain electrode of the second P-type transistor for outputting the second clock signal, and the input clock signal is inputted into a gate electrode of the second N-type transistor; and
the clock buffer further comprises:
a logical circuit, for generating a first delayed clock signal and a second delayed clock signal according to the input clock signal, wherein the first delayed clock signal is inputted into a gate electrode of the first P-type transistor, and the second delayed clock signal is inputted into a gate electrode of the second N-type transistor.

10. The clock buffer of claim 9, further comprising:
a high-pass filter, coupled between the logical circuit and the input clock signal.

11. A clock buffer, comprising:
a first circuit, for receiving an input clock signal to generate a first clock signal, wherein a transition time of a rising edge of the first clock signal is larger than a transition time of a falling edge of the first clock signal;
a second circuit, for receiving the input clock signal to generate a second clock signal, wherein a transition time of a falling edge of the second clock signal is larger than a transition time of a rising edge of the second clock signal; and
an edge collector, coupled to the first circuit and the second circuit, for generating an output clock signal by using the falling edge of the first clock signal and the rising edge of the second clock signal.

12. The clock buffer of claim 11, wherein the edge collector does not use the rising edge of the first clock signal and the falling edge of the second clock signal to generate the output clock signal.

13. The clock buffer of claim 11, wherein the first circuit comprises a first inverter configured to output the first clock signal.

14. The clock buffer of claim 13, wherein sizes of a P-type transistor and an N-type transistor of the first inverter are different.

15. The clock buffer of claim 13, wherein the first circuit comprises a second inverter configured to output the second clock signal.

16. The clock buffer of claim 15, wherein sizes of a first P-type transistor and a first N-type transistor of the first inverter are different; and sizes of a second P-type transistor and a second N-type transistor of the second inverter are different.

* * * * *